(12) United States Patent
Park et al.

(10) Patent No.: US 8,780,645 B2
(45) Date of Patent: Jul. 15, 2014

(54) DATA INPUT CIRCUIT OF NONVOLATILE MEMORY DEVICE

(75) Inventors: Jong Tai Park, Gyeonggi-do (KR); Won Sub Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 365 days.

(21) Appl. No.: 13/226,585

(22) Filed: Sep. 7, 2011

(65) Prior Publication Data

US 2012/0057414 A1 Mar. 8, 2012

(30) Foreign Application Priority Data

Sep. 7, 2010 (KR) .......................... 10-2010-0087473
Aug. 25, 2011 (KR) .......................... 10-2011-0085083

(51) Int. Cl.
*G11C 7/10* (2006.01)

(52) U.S. Cl.
USPC ............ 365/189.05; 365/189.02; 365/189.11; 365/210.1; 365/219; 365/230.08

(58) Field of Classification Search
USPC ........ 365/189.02, 189.05, 189.11, 210.1, 219
See application file for complete search history.

(56) References Cited

U.S. PATENT DOCUMENTS 6,567,323 B2 * 5/2003 Pitts et al. ..................... 365/200

* cited by examiner

*Primary Examiner* — Tha-O H Bui
(74) *Attorney, Agent, or Firm* — IP & T Group LLP

(57) ABSTRACT

The data input circuit of a nonvolatile memory device includes a redundancy multiplexer configured to selectively output normal data and redundancy data to an internal global data line in response to a redundancy signal, a plurality of pipe registers coupled to the internal global data line and configured to latch normal data or redundancy data received through the internal global data line in response to a plurality of respective latch signals, and an output multiplexer configured to sequentially output the latched data in response to a plurality of selection signals.

12 Claims, 5 Drawing Sheets

US 8,780,645 B2

DATA INPUT CIRCUIT OF NONVOLATILE MEMORY DEVICE

CROSS-REFERENCE TO RELATED APPLICATION

Priority to Korean patent application number 10-2010-0087473 filed on Sep. 7, 2010 and 10-2011-0085083 filed on Aug. 25, 2011, the entire disclosures of which are incorporated by reference herein, are claimed.

BACKGROUND

Exemplary embodiments relate to the data input circuit of a nonvolatile memory device and, more particularly, to the data input circuit of a nonvolatile memory device operating at a high speed.

In a data input operation, a nonvolatile memory device receives normal data and redundancy data through global I/O lines, temporarily stores the received data in a pipe register, and sends the stored data to a corresponding memory cell block for being programmed.

In order to increase the operation speed of the nonvolatile memory device, the received data are to be stored in the pipe register in proportion to the speed of the normal data and redundancy data sequentially received through global I/O line. In conventional nonvolatile memory devices, the data input speed is determined by the storage speed of a pipe latch because a pipe latch is coupled/assigned to a global data line.

BRIEF SUMMARY

Exemplary embodiments relate to the data input circuit of a nonvolatile memory device, wherein a plurality of pipe registers are coupled to one global data line and are configured to sequentially latch data when the data are sequentially received through the global data line, thereby being capable of increasing the data input speed of the nonvolatile memory device.

A data input circuit of a nonvolatile memory device according to an aspect of this disclosure includes a redundancy multiplexer configured to selectively output normal data and redundancy data to an internal global data line in response to a redundancy signal, a plurality of pipe registers coupled to the internal global data line and configured to latch the normal data or the redundancy data received through the internal global data line in response to a plurality of respective latch signals, and an output multiplexer configured to sequentially output the latched data in response to a plurality of selection signals.

A data input circuit of a nonvolatile memory device according to another aspect of this disclosure includes a plurality of pipe registers coupled to a global data line and a redundancy global data line and configured to sequentially latch normal data received through the global data line or redundancy data received through the redundancy global data line in response to a plurality of respective latch signals and an output multiplexer configured to selectively couple the pipe registers to an output line in response to a plurality of selection signals.

DESCRIPTION OF EMBODIMENTS

Hereinafter, some exemplary embodiments of the present disclosure will be described in detail with reference to the accompanying drawings. The figures are provided to enable those of ordinary skill in the art to make and use the exemplary embodiments of the disclosure.

Figure 1:
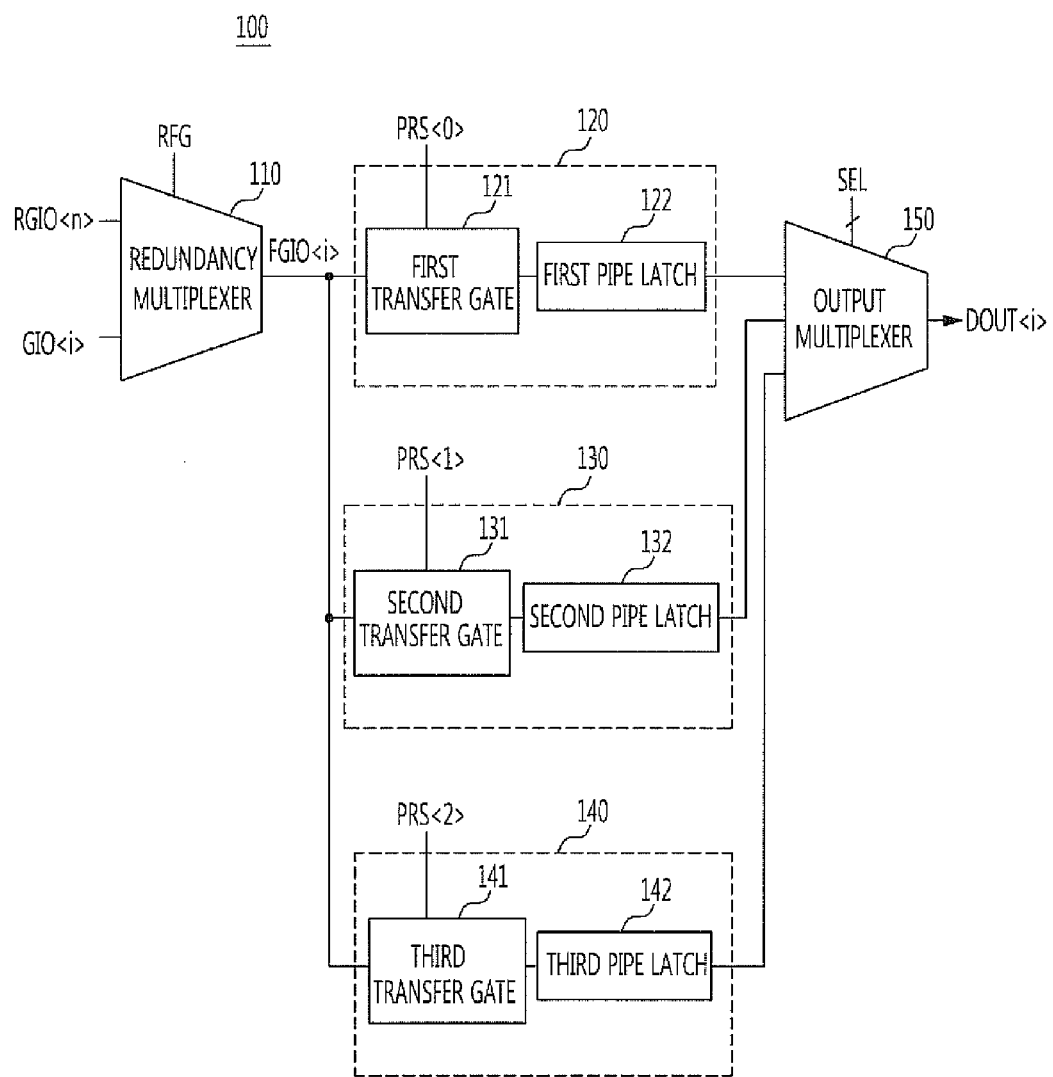
FIG. 1 is a configuration diagram showing the data input circuit of a nonvolatile memory device according to an exemplary embodiment of this disclosure.

FIG. 1 is a configuration diagram showing the data input circuit of a nonvolatile memory device according to an exemplary embodiment of this disclosure.

Referring to FIG. 1, the data input circuit 100 includes a redundancy multiplexer 110, first to third pipe registers 120, 130, and 140, and an output multiplexer 150. Although the three pipe registers are illustrated in the embodiment of this disclosure, three or more pipe registers may be used.

The redundancy multiplexer 110 receives normal data D0 to Dk and redundancy data RD respectively through a normal global data line GIO<i> and a redundancy global data line RGIO<n> and sends them to an internal global data line FGIO<i> as internal data in response to a redundancy signal RFG. More particularly, when the redundancy data RD is received while the normal data D0 to Dk are sequentially received, the redundancy multiplexer 110 sends the redundancy data RD to the internal global data line FGIO<i>, instead of the normal data (for example, D1) being received.

The first to third pipe registers 120, 130, and 140 are coupled between the internal global data line FGIO<i> and the output multiplexer 150.

The first pipe register 120 includes a first transfer gate 121 and a first pipe latch 122 coupled in series between the internal global data line FGIO<i> and the output multiplexer 150. The first transfer gate 121 sends the normal data or the redundancy data, received from the internal global data line FGIO<i>, to the first pipe latch 122 in response to a latch signal PRS<0>. The first pipe latch 122 temporarily stores the normal data or the redundancy data received from the first transfer gate 121 and outputs them to the output multiplexer 150.

The second pipe register 130 includes a second transfer gate 131 and a second pipe latch 132 coupled in series between the internal global data line FGIO<i> and the output multiplexer 150. The second transfer gate 131 sends the normal data or the redundancy data, received from the internal global data line FGIO<i>, to the second pipe latch 132 in response to a latch signal PRS<1>. The second pipe latch 132 temporarily stores the normal data or the redundancy data received from the second transfer gate 131 and outputs them to the output multiplexer 150.

The third pipe register 140 includes a third transfer gate 141 and a third pipe latch 142 coupled in series between the internal global data line FGIO<i> and the output multiplexer 150. The third transfer gate 141 sends the normal data or the redundancy data, received from the internal global data line FGIO<i>, to the third pipe latch 142 in response to a latch signal PRS<2>. The third pipe latch 142 temporarily stores the normal data or the redundancy data received from the third transfer gate 141 and outputs them to the output multiplexer 150.

The plurality of latch signals PRS<0> to PRS<2> are sequentially and repeatedly enabled.

The output multiplexer 150 sequentially outputs the normal data or the redundancy data, received from the first to third pipe registers 120 to 140, to the output line DOUT<i> in the sequence of the first to third pipe registers 120 to 140 in response to a plurality of selection signals SEL.

Figure 2:
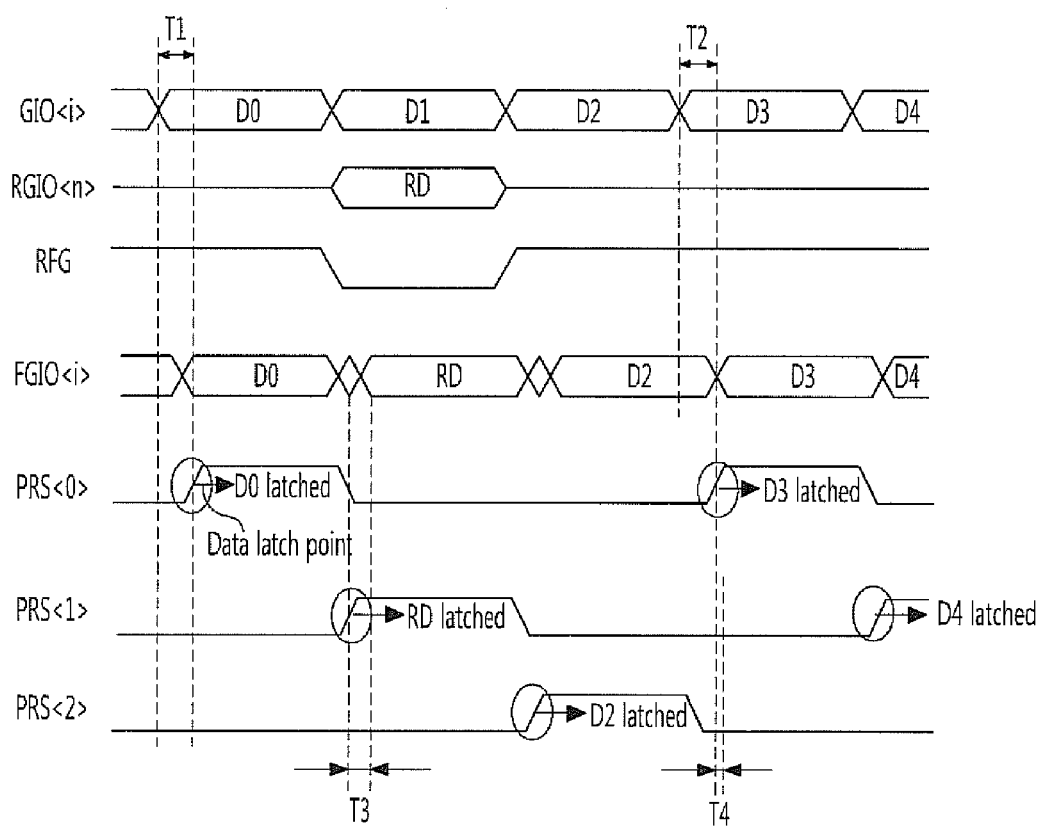
FIG. 2 is a waveform of signals illustrating the operation of the data input circuit of a nonvolatile memory device according to an exemplary embodiment of this disclosure.

FIG. 2 is a waveform of signals illustrating the operation of the data input circuit of a nonvolatile memory device according to an exemplary embodiment of this disclosure.

The operation of the data input circuit of a nonvolatile memory device according to an exemplary embodiment of this disclosure is described below with reference to FIGS. 1 and 2.

First, the normal data D0 to Dk are sequentially inputted to the redundancy multiplexer 110 through the normal global data line GIO<i>. The redundancy multiplexer 110 sequentially sends the normal data D0 to Dk to the internal global data line FGIO<i> in response to the redundancy signal RFG. If the redundancy data RD is received through the redundancy global data line RGIO<n> while the normal data are received (for example, D1), the redundancy multiplexer 110 sends the redundancy data RD to the internal global data line FGIO<i> instead of the normal data D1 in response to the redundancy signal RFG.

The first transfer gate 121 of the first pipe register 120 sends the normal data D0, received from the internal global data line FGIO<i>, to the first pipe latch 122 in response to the latch signal PRS<0>. The first pipe latch 122 temporarily stores the normal data D0 received from the first transfer gate 121.

The second transfer gate 131 of the second pipe register 130 sends the redundancy data RD, received from the internal global data line FGIO<i>, to the second pipe latch 132 in response to the latch signal PRS<1>. The second pipe latch 132 temporarily stores the redundancy data RD received from the second transfer gate 131.

The third transfer gate 141 of the third pipe register 140 sends the normal data D2, received from the internal global data line FGIO<i>, to the third pipe latch 142 in response to the latch signal PRS<2>. The third pipe latch 142 temporarily stores the normal data D2 received from the third transfer gate 141.

At this time, the output multiplexer 150 outputs the normal data D0, received from the first pipe register 120, to the output line DOUT in response to one of the selection signals SEL.

Next, the first transfer gate 121 of the first pipe register 120 sends the normal data D3, received from the internal global data line FGIO<i>, to the first pipe latch 122 in response to the latch signal PRS<0>. The first pipe latch 122 temporarily stores the normal data D3 received from the first transfer gate 121.

At this time, the output multiplexer 150 outputs the redundancy data RD, stored in the second pipe latch 132 of the second pipe register 130, to the output line DOUT<i> in response to one of the selection signals SEL.

Next, the second transfer gate 131 of the second pipe register 130 sends the normal data D4, received from the internal global data line FGIO<i>, to the second pipe latch 132 in response to the latch signal PRS<1>. The second pipe latch 132 temporarily stores the normal data D4 received from the second transfer gate 131.

As described above, according to the embodiment of this disclosure, the plurality of pipe registers are coupled to the internal global data line and are configured to sequentially latch data. Accordingly, data received through the internal global data line can be rapidly latched.

Figure 3:
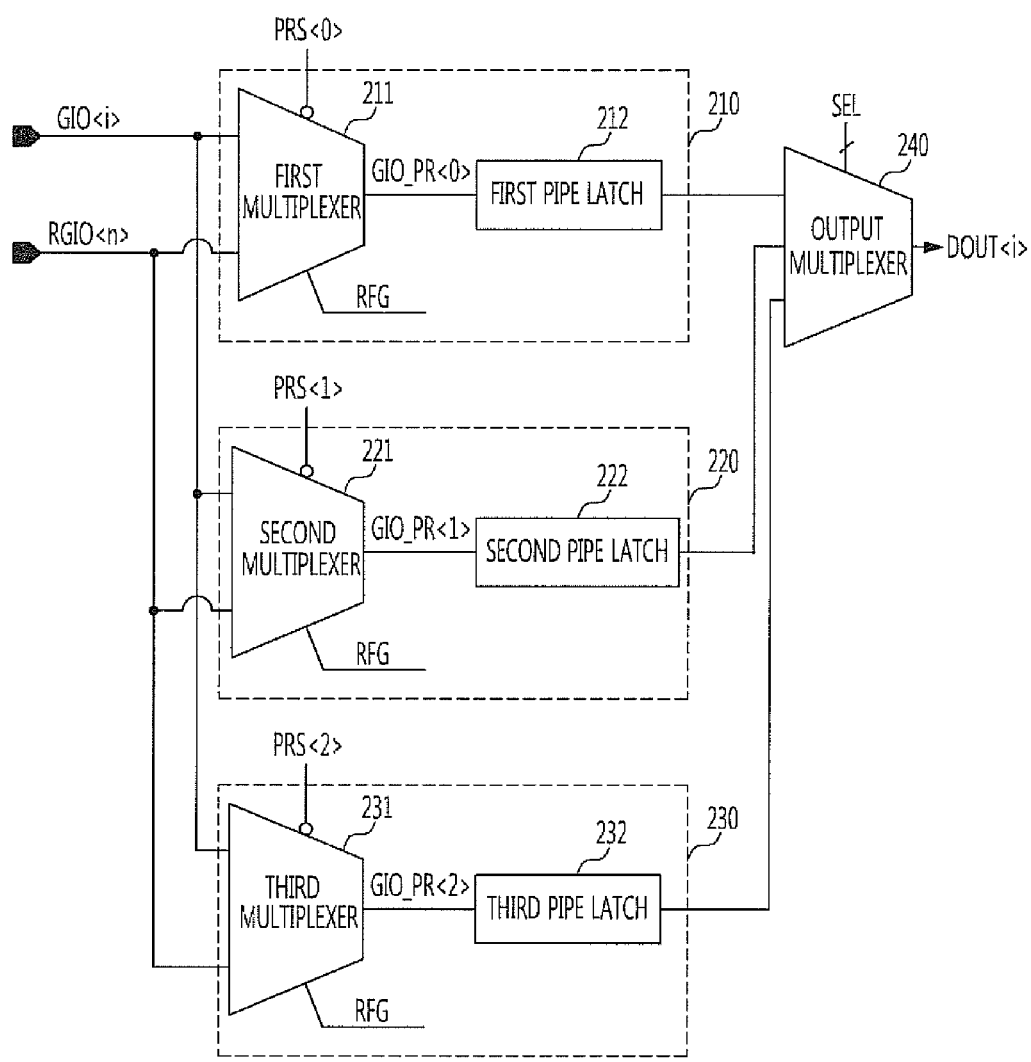
FIG. 3 is a configuration diagram showing the data input circuit of a nonvolatile memory device according to another exemplary embodiment of this disclosure.

FIG. 3 is a configuration diagram showing the data input circuit of a nonvolatile memory device according to another exemplary embodiment of this disclosure.

Referring to FIG. 3, the data input circuit includes first to third pipe registers 210 to 230 and an output multiplexer 240.

The first to third pipe registers 210 to 230 are coupled between normal and redundancy global data lines GIO<i> and RGIO<n> and the output multiplexer 240.

The first to third pipe registers 210 to 230 receive normal data D0 to Dk sequentially from the normal global data line GIO<i> and redundancy data RD from the redundancy global data line RGIO<n>, temporarily store the received data, and sequentially output the stored data to the output multiplexer 240.

The first pipe register 210 includes a first multiplexer 211 and a first pipe latch 212 which are coupled in series. The first multiplexer 211 selects one data, from among the normal data D0 to Dk received from the normal global data line GIO<i> and the redundancy data RD received from the redundancy global data line RGIO<n>, in response to a redundancy signal RFG and outputs an input data GIO_PR<0> to the first pipe latch 212 in response to a latch signal PRS<0>. The first pipe latch 212 temporarily stores the input data GIO_PR<0> received from the first multiplexer 211 and outputs the input data GIO_PR<0> to the output multiplexer 240.

The second pipe register 220 includes a second multiplexer 221 and the second pipe latch 222 which are coupled in series. The second multiplexer 221 selects one data, from among the normal data D0 to Dk received from the normal global data line GIO<i> and the redundancy data RD received from the redundancy global data line RGIO<n>, in response to the redundancy signal RFG and outputs input data GIO_PR<1> to the second pipe latch 222 in response to a latch signal PRS<1>. The second pipe latch 222 temporarily stores the input data GIO_PR<1> received from the second multiplexer 221 and outputs it to the output multiplexer 240.

The third pipe register 230 includes a third multiplexer 231 and a third pipe latch 232 which are coupled in series. The third multiplexer 231 selects one data, from among the normal data D0 to Dk received from the normal global data line GIO<i> and the redundancy data RD received from the redundancy global data line RGIO<n>, in response to the redundancy signal RFG and outputs input data GIO_PR<2> to the third pipe latch 232 in response to a latch signal PRS<2>. The third pipe latch 232 temporarily stores the input data GIO_PR<2> received from the third multiplexer 231 and outputs it to the output multiplexer 240.

The plurality of latch signals PRS<0> to PRS<2> are sequentially and repeatedly enabled.

Figure 4:
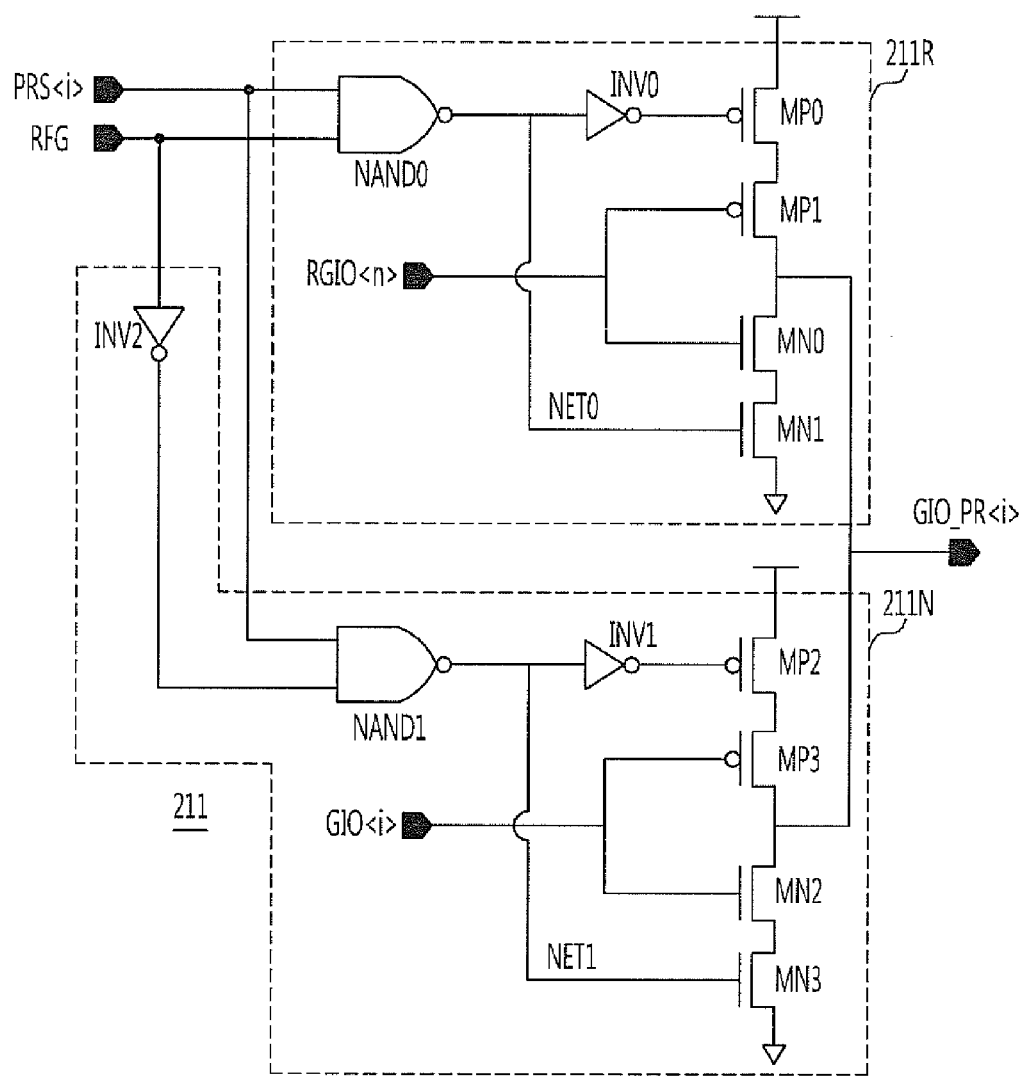
FIG. 4 is a detailed circuit diagram of a multiplexer shown in FIG. 3.

FIG. 4 is a detailed circuit diagram of the first to third multiplexers shown in FIG. 3.

The first to third multiplexers 211, 221, and 231 of FIG. 3 may have the same structure, and only the multiplexer 211 is described as an example.

The multiplexer 211 includes a redundancy data selector 211R and a normal data selector 211N.

The redundancy data selector 211R includes a NAND gate NAND0, an inverter INV0, and a plurality of transistors MP0, MP1, MN0, and MN1. The NAND gate NAND0 generates an output signal NET0 by logically combining the latch signal PRS<i> and the redundancy signal RFG. The inverter INV0 inverts the output signal NET0 of the NAND gate NAND0 and outputs an inverted signal. The plurality of transistors MP0, MP1, MN0, and MN1 are coupled in series between a power supply voltage and a ground power source. The transistor MP0 is driven in response to the output signal of the inverter INV0. The transistors MP1 and MN0 are driven in response to a logic level of the redundancy data received through the redundancy global data line RGIO<n>. The transistor MN1 is driven in response to the output signal NET0 of the NAND gate NAND0. Accordingly, when both the redundancy signal RFG and the latch signal PRS<i> are activated to a low level, the redundancy data selector 211R inverts a logic level of the redundancy data received though the redundancy global data line RGIO<n> and outputs the inverted data as the input data GIO_PR<i>.

The normal data selector 211N includes an inverter INV2, a NAND gate NAND1, an inverter INV1, and a plurality of transistors MP2, MP3, MN2, and MN3. The inverter INV2 inverts the redundancy signal RFG and outputs an inverted redundancy signal. The NAND gate NAND1 generates an output signal NET1 by logically combining the latch signal PRS<i> and the inverted redundancy signal. The inverter INV1 inverts the output signal NET1 of the NAND gate NAND1 and outputs an inverted signal. The plurality of transistors MP2, MP3, MN2, and MN3 are coupled in series between the power supply voltage and the ground power source. The transistor MP2 is driven in response to the output signal of the inverter INV1. The transistors MP3 and MN2 are driven in response to a logic level of the normal data received through the global data line GIO<n>. The transistor MN3 is driven in response to the output signal NET1 of the NAND gate NAND1. Accordingly, when the latch signal PRS<i> is activated to a low level and the redundancy signal RFG is inactivated in a high level, the normal data selector 211R inverts a logic level of the normal data received through the global data line GIO<n> and outputs inverted data as the input data GIO_PR<i>.

Figure 5:
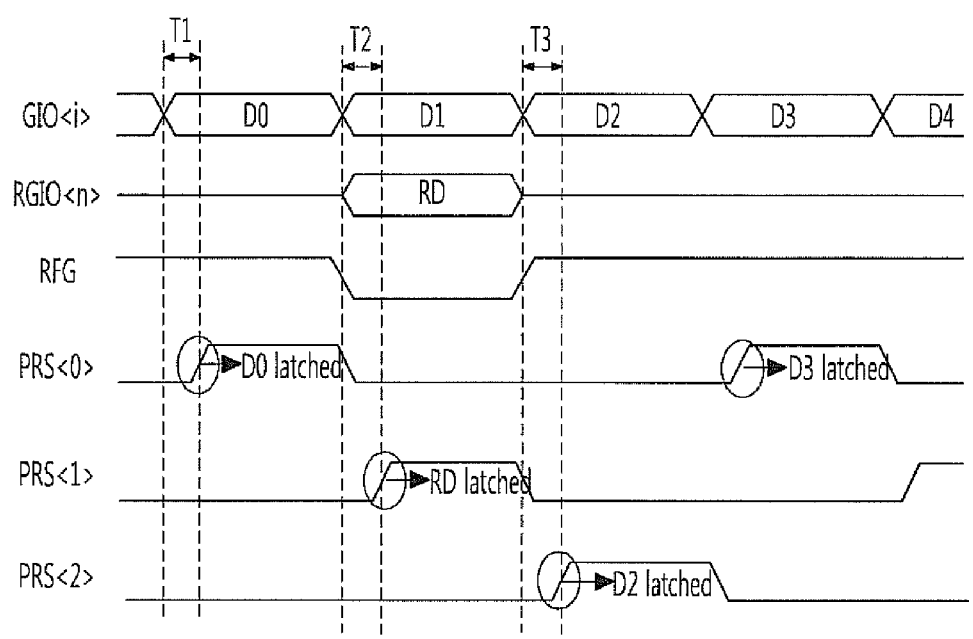
FIG. 5 is a waveform of signals illustrating the operation of the data input circuit of a nonvolatile memory device according to another exemplary embodiment of this disclosure.

FIG. 5 is a waveform of signals illustrating the operation of the data input circuit of a nonvolatile memory device according to another exemplary embodiment of this disclosure.

The operation of the data input circuit of a nonvolatile memory device according to another exemplary embodiment of this disclosure is described below with reference to FIGS. 3 to 5.

First, the normal data D0 to Dk are sequentially received through the normal global data line GIO<i>. Furthermore, when the normal data D1 is received, the redundancy data RD is received through the redundancy global data line RGIO<n>

When the normal data D0 is received, the first multiplexer 211 of the first pipe register 210 is activated in response to the latch signal PRS<0>. The first multiplexer 211 selects the normal data D0 in response to the redundancy signal RFG and outputs it as the input data GIO_PR<0>. The first pipe latch 212 receives the input data GIO_PR<0> and temporarily stores the input data GIO_PR<0>.

When the normal data D1 is received, the second multiplexer 221 of the second pipe register 220 is activated in response to the latch signal PRS<1>. The second multiplexer 221 selects the redundancy data RD in response to the redundancy signal RFG and outputs it as the input data GIO_PR<1>. The second pipe latch 222 receives the input data GIO_PR<1> and temporarily stores the input data GIO_PR<1>.

When the normal data D2 is received, the third multiplexer 231 of the third pipe register 230 is activated in response to the latch signal PRS<2>. The third multiplexer 231 selects the normal data D2 in response to the redundancy signal RFG and outputs it as the input data GIO_PR<2>. The third pipe latch 232 receives the input data GIO_PR<2> and temporarily stores the input data GIO_PR<2>.

At this time, the output multiplexer 240 outputs the normal data D0, stored in the first pipe latch 212, to the output line DOUT<i> in response to one of the selection signals SEL.

Next, the first multiplexer 211 of the first pipe register 210 sends the received normal data D3 to the first pipe latch 212 as the input data GIO_PR<0> in response to the latch signal PRS<0> and the redundancy signal RFG. The first pipe latch 212 temporarily stores the input data GIO_PR<0> received from the first multiplexer 211.

At this time, the output multiplexer 240 outputs the redundancy data RD, stored in the second pipe latch 222, to the output line DOUT<i> in response to one of the selection signals SEL.

Next, the second multiplexer 221 of the second pipe register 220 sends the received normal data D4 to the second pipe latch 222 as the input data GIO_PR<1> in response to the latch signal PRS<1> and the redundancy signal RFG. The second pipe latch 222 temporarily stores the input data GIO_PR<1> received from the second multiplexer 221.

As described above, according to the present embodiment of this disclosure, the plurality of pipe registers are coupled to the global data line and the redundancy global data line and are configured to sequentially latch data. Accordingly, data received through the global data line and the redundancy global data line can be rapidly latched.

According to the exemplary embodiments of this disclosure, the plurality of pipe registers may be coupled to a global data line and configured to sequentially latch data which are sequentially received through the global data line. Accordingly, the data input speed can be increased.

What is claimed is:

1. A data input circuit of a nonvolatile memory device, comprising:
    a redundancy multiplexer configured to selectively output normal data and redundancy data to an internal global data line in response to a redundancy signal;
    a plurality of pipe registers each coupled to the internal global data line and configured to latch the normal data or the redundancy data received through the internal global data line in response to a plurality of respective latch signals; and
    an output multiplexer configured to sequentially output the latched data in response to a plurality of selection signals,
    wherein each of the pipe registers comprises:
        a transfer gate configured to transfer the normal data or the redundancy data in response to one of the latch signals; and
        a pipe latch configured to temporarily store the transferred data and output the stored data to the output multiplexer.

2. The data input circuit of claim 1, wherein the plurality of latch signals sequentially activates the pipe registers to sequentially latch the normal data or the redundancy datum sequentially received through the internal global data line.

3. The data input circuit of claim 1, wherein the redundancy multiplexer is configured to output the redundancy data by replacing the normal data inputted when the redundancy data is inputted to the redundancy multiplexer.

4. The data input circuit of claim 1, wherein the redundancy multiplexer selects the redundancy data instead of the normal data in response to the redundancy signal, activated when the redundancy data is received, and outputs the redundancy data to the internal global data line.

5. The data input circuit of claim 1, wherein when one of the pipe registers latches currently inputted data of the normal data or the redundancy data, others of the pipe registers are configured to output previously inputted data of the normal data or the redundancy data to the output multiplexer, wherein the previously inputted data is inputted to and latched in the other pipe registers.

6. The data input circuit of claim 5, wherein the output multiplexer is configured to select one of the outputted data from the others of the pipe registers in response to one of the selection signals and output the selected data.

7. The data input circuit of claim 1, wherein the latch signals and the selection signals are sequentially and repeatedly activated.

8. A data input circuit of a nonvolatile memory device, comprising:
   a plurality of pipe registers each coupled to a global data line and a redundancy global data line and configured to sequentially latch normal data received through the global data line or redundancy data received through the redundancy global data line in response to a plurality of respective latch signals; and
   an output multiplexer configured to selectively couple the pipe registers to an output line in response to a plurality of selection signals,
   wherein each of the pipe registers comprises:
      a multiplexer configured to select one of the normal data and the redundancy data in response to a redundancy signal and output the selected data as an input data; and
      a pipe latch configured to temporarily store the input data and output the stored data to the output multiplexer.

9. The data input circuit of claim 8, wherein the multiplexer comprises:
   a redundancy data selector configured to invert the redundancy data in response to the redundancy signal and output the inverted data as the input data; and
   a normal data selector configured to invert the normal data in response to the redundancy signal and output the inverted data as the input data.

10. The data input circuit of claim 9, wherein the redundancy signal activates one of the redundancy data selector and the normal data selector.

11. The data input circuit of claim 8, wherein:
   each of the multiplexers of the pipe registers is configured to be activated in response to one of the latch signals, and
   the latch signals are sequentially and repeatedly enabled.

12. The data input circuit of claim 8, wherein the output multiplexer is configured to sequentially output the latched data received from the pipe registers to the output line.

* * * * *